(12) United States Patent
Lukofsky et al.

(10) Patent No.: US 10,038,264 B2
(45) Date of Patent: Jul. 31, 2018

(54) UNIVERSAL COUPLING FOR ELECTRICALLY CONNECTING A FLEXIBLE PRINTED CIRCUIT TO ANOTHER FLEXIBLE PRINTED CIRCUIT IN MULTIPLE DIFFERENT ORIENTATIONS

(71) Applicant: Microsoft Technology Licensing, LLC, Redmond, WA (US)

(72) Inventors: David Lukofsky, San Francisco, CA (US); Joseph Christopher Bolling, San Francisco, CA (US); Jeffrey M. Quackenbush, San Francisco, CA (US); Tapani von Rauner, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/351,237

(22) Filed: Nov. 14, 2016

(65) Prior Publication Data
US 2018/0138617 A1    May 17, 2018

(51) Int. Cl.
| | |
|---|---|
| *H01R 12/00* | (2006.01) |
| *H01R 12/91* | (2011.01) |
| *H01R 12/78* | (2011.01) |
| *H01R 12/72* | (2011.01) |
| *H04N 13/04* | (2006.01) |

(52) U.S. Cl.
CPC ........... *H01R 12/91* (2013.01); *H01R 12/721* (2013.01); *H01R 12/78* (2013.01); *H04N 13/044* (2013.01)

(58) Field of Classification Search
CPC ........ H01R 9/096; H01R 12/00; H01R 12/52; H01R 12/62; H01R 12/714; H01R 12/716; H01R 12/78; H01R 12/91; H01R 12/59; H01R 12/721; H01R 35/04
USPC ................ 439/11, 13, 18, 22, 65, 67, 69, 74
See application file for complete search history.

(56) References Cited

U.S. PATENT DOCUMENTS

| | | | | |
|---|---|---|---|---|
| 5,219,292 A | * | 6/1993 | Dickirson | .............. H01R 9/096 439/65 |
| 5,438,223 A | | 8/1995 | Higashi et al. | |
| 5,764,497 A | * | 6/1998 | Mizumo | ................ H05K 1/147 257/776 |
| 5,777,855 A | * | 7/1998 | Yokajty | .................. H01R 12/62 361/749 |

(Continued)

OTHER PUBLICATIONS

"Get Connected (3M Anisotropic Conductive Film (ACF) Interconnect Solutions)", Published on: Sep. 12, 2015, Available at: http://multimedia.3m.com/mws/media/296669O/3mtm-anisotropic-conductive-film-adhesive-get-connected.pdf.

(Continued)

*Primary Examiner* — Chandrika Prasad
(74) *Attorney, Agent, or Firm* — Rainier Patents, P.S.

(57) ABSTRACT

A universal coupling is disclosed for electrically and mechanically connecting flexible printed circuit (FPC) components within asymmetric FPC modules. The universal coupling allows a first FPC component to be connected to a second FPC component in two or more different orientations. This allows identical FPC components to be used in two or more asymmetric FPC modules. This in turn allows a reduction in the number of parts and tooling required to fabricate the two or more asymmetric FPC modules, and a simplification of the fabrication process.

20 Claims, 6 Drawing Sheets

(56) References Cited

U.S. PATENT DOCUMENTS

| | | | |
|---|---|---|---|
| 5,920,465 A * | 7/1999 | Tanaka | H01R 12/62 |
| | | | 361/749 |
| 6,504,595 B2 | 1/2003 | Nicolaisen et al. | |
| 7,291,925 B2 | 11/2007 | Han et al. | |
| 7,888,604 B2 * | 2/2011 | Kawate | H05K 3/323 |
| | | | 174/254 |
| 8,353,102 B2 | 1/2013 | Koyama et al. | |
| 8,562,360 B2 * | 10/2013 | Ching | H01R 12/79 |
| | | | 439/67 |
| 8,802,214 B2 | 8/2014 | Liang et al. | |
| 9,426,889 B2 * | 8/2016 | Liu | H05K 1/147 |
| 2003/0077923 A1 * | 4/2003 | Matsuo | H01R 12/777 |
| | | | 439/67 |
| 2004/0074670 A1 * | 4/2004 | Kitagawa | H01R 12/62 |
| | | | 174/262 |
| 2005/0098902 A1 | 5/2005 | Ho et al. | |
| 2005/0233587 A1 | 10/2005 | Baleras et al. | |
| 2008/0165158 A1 | 7/2008 | Hotelling et al. | |
| 2008/0309633 A1 | 12/2008 | Hotelling et al. | |
| 2013/0045610 A1 * | 2/2013 | Drew | H01R 4/188 |
| | | | 439/34 |
| 2014/0001023 A1 | 1/2014 | Guard | |
| 2014/0335729 A1 * | 11/2014 | Little | H01R 24/60 |
| | | | 439/607.53 |
| 2014/0352440 A1 | 12/2014 | Fennell et al. | |
| 2016/0029503 A1 | 1/2016 | Shedletsky et al. | |

OTHER PUBLICATIONS

Ishibashi, et al., "A new anisotropic conductive film with arrayed conductive particles", In AMP Journal of Technology, vol. 5, Jun. 1996, pp. 24-30.

* cited by examiner

UNIVERSAL COUPLING FOR ELECTRICALLY CONNECTING A FLEXIBLE PRINTED CIRCUIT TO ANOTHER FLEXIBLE PRINTED CIRCUIT IN MULTIPLE DIFFERENT ORIENTATIONS

BACKGROUND

For efficiencies in the fabrication of an electronic device, electronic components of the device are often electrically and mechanically coupled to each other via a flexible printed circuit to form a flexible printed circuit module. The flexible printed circuit (FPC) module may be prefabricated and easily assembled as a module into the electronic device.

In fabricating the FPC module, it is desirable to decouple the yield loss of an expensive electronic component from an inexpensive electronic component. That way, a defective inexpensive electronic component will not result in loss of the entire FPC module including the expensive electronic component. It is therefore typical that each electronic component may be affixed to its own flexible printed circuit to form an FPC component. Each FPC component may include a set of electrical film contacts so that, once the respective FPC components have been fabricated and verified for functionality, the respective FPC components may be electrically and mechanically connected to each other via the film contacts to form the completed FPC module.

It often happens that FPC modules come in pairs for inclusion in the electronic device. For example, where the electronic device is a head mounted display device, a pair of FPC camera modules are needed, one for each eye. In this example, the FPC camera modules may for example be LCoS displays for displaying images to the left and right eyes, or eye tracking cameras for tracking movement of the left and right eyes. In this scenario, although the electronic components used in the respective FPC modules are identical, the FPC components in the first and second FPC modules may be asymmetric.

For example, prior art FIGS. 1A and 1B show a first FPC module 50 including a first FPC component 52 about to be connected to a second FPC component 54 via a first set of electrical film contacts 56 on the components 52, 54. FIGS. 1A and 1B also show a second FPC module 60 including a third FPC component 62 connected to a fourth FPC component 64 via a second set of electrical film contacts 66. The first and third FPC components 52, 62 may be connected in their respective FPC modules at different angles. For example, where the FPC modules 50, 60 are FPC camera modules used in a head mounted display device, the camera modules in the first and third FPC components 52, 62 need to be provided at different angles for the left and right eyes.

Because the electrical film contacts 56 and 66 are different (asymmetric) in the first and second FPC module 50, 60, four separate parts are required when fabricating the pair of FPC modules 50, 60: parts 52, 54, 62, 64. In addition to requiring separate parts, separate tooling is required to fabricate each part.

SUMMARY

Embodiments of the present technology relate to a universal coupling for electrically and mechanically connecting flexible printed circuit (FPC) components within asymmetric FPC modules. The universal coupling allow a first FPC component to be connected to a second FPC component in two or more different orientations. This allows identical FPC components to be used in two or more asymmetric FPC modules. This in turn allows a reduction in the number of parts and tooling required to fabricate the two or more asymmetric FPC modules, and a simplification of the fabrication process.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

Prior art

DETAILED DESCRIPTION

Embodiments of the present technology will now be described with reference to the figures, which in general relate to a universal coupling for electrically and mechanically connecting flexible printed circuit (FPC) components within asymmetric FPC modules. In embodiments, the universal coupling may be printed onto first and second FPC components, allowing the first and second FPC components to be affixed to each other in at least two asymmetric orientations. Thus, the first and second FPC components, each including the universal coupling, may be identical to each other and in used to fabricate two or more different FPC modules.

Figure 2:
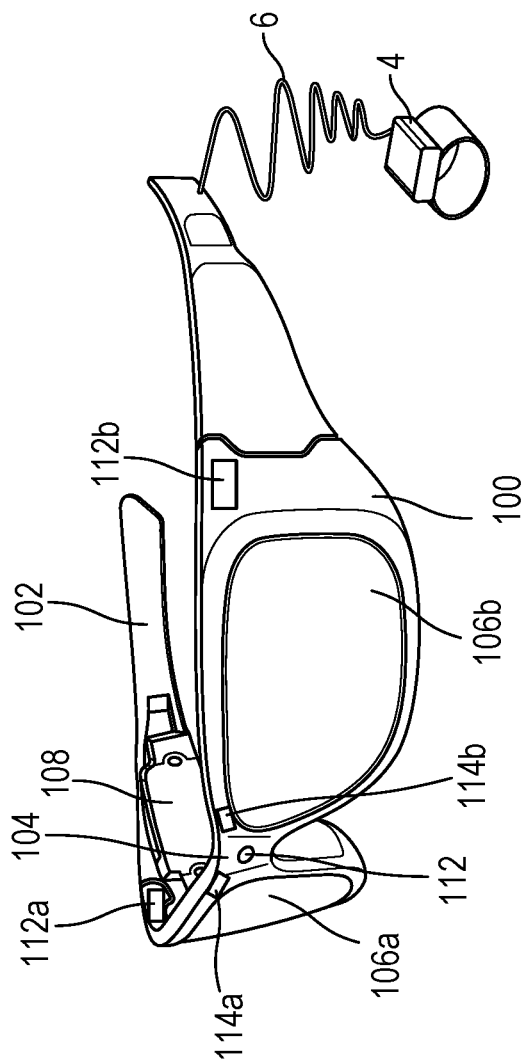
FIG. 2 is a perspective view of one embodiment of a head mounted display unit.

In embodiments explained below, the universal coupling may be used to form a pair of FPC components included in a single electronic device. For example, the universal coupling may be used to form first and second FPC camera modules, for the left and right eyes, respectively, in a head mounted display device. An example of such a head mounted display device 100 is shown in FIG. 2. The head mounted display device 100 may include glasses frame 102 and a nose bridge 104 so that the head mounted display device 100 may be worn comfortably on a user's head. The device 100 may further include optical assemblies 106a and 106b including lenses and optical wave guides for presenting real and virtual objects to the left and right eyes of a wearer. Control circuits 108 may be mounted in the frame 102 to provide various electronics that support the components of head mounted display device 100. The head mounted display device 100 may include or be in communication with its own processing unit 4, for example via a flexible wire 6.

The head mounted display device 100 may further include a pair of microdisplay cameras 112a and 112b (shown schematically) for generating an image for display to the optical assemblies 106a and 106b. While a variety of microdisplay cameras are known for such a purpose, the display cameras may for example operate by digital light processing (DLP), liquid crystal on silicon (LCOS) display technology and Mirasol® display technology from Qualcomm, Inc. The microdisplay cameras 112a and 112b may operate according to other technologies in further embodiments.

The head mounted display device 100 may alternatively or additionally include a pair of eye tracking cameras 114a and 114b (shown schematically) for tracking a position of the user's left and right eyes. By tracking the position of the user's eyes, the head mounted device 100 can track the eye gaze of a user to determine what a user is looking at. The eye tracking cameras 114a and 114b may operate according to a variety of technologies. However, in general, the eye tracking cameras 114a and 114b obtain an image of the left and right eyes using computer vision techniques to determine the location of the pupil within the eye socket. Further details regarding examples of the microdisplay cameras 112a, 112b and eye tracking cameras 114a, 114b are provided for example in U.S. Patent Publication No. 2013/0326364 entitled "Position Relative Hologram Interactions," published on Dec. 5, 2013.

Figure 3:
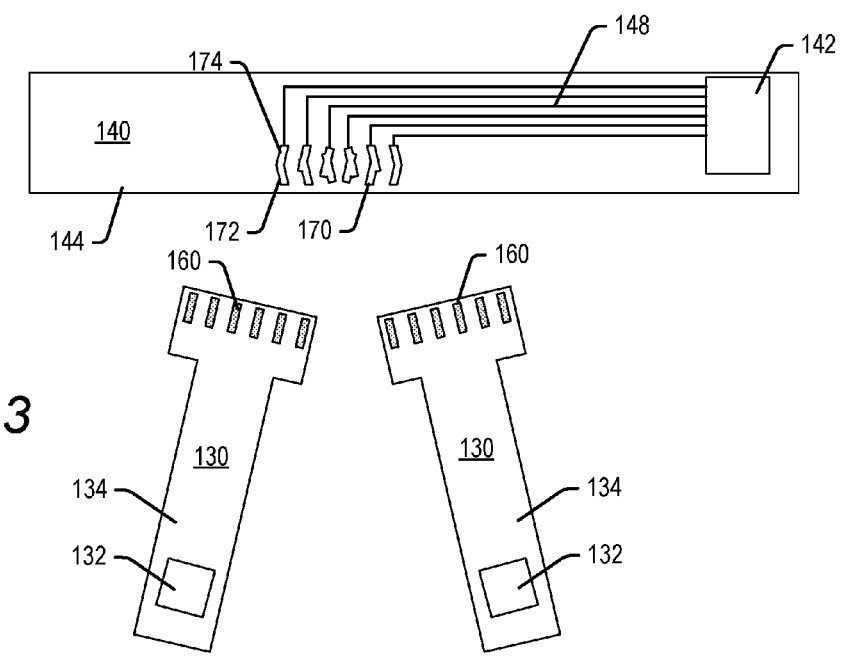
FIG. 3 shows flexible printed circuit modules to be connected by a universal coupling according to embodiments of the present technology.
Figure 4:
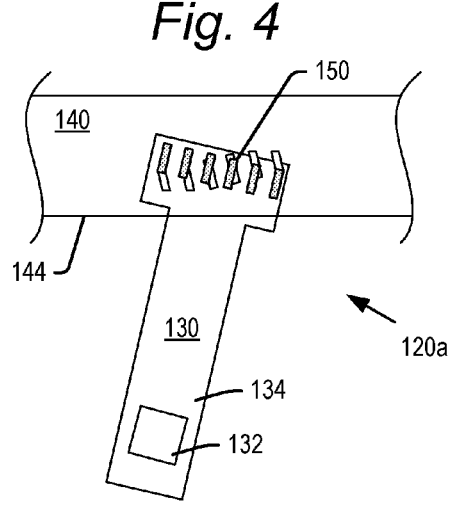
FIGS. 4 and 5 show two of the same flexible printed circuit modules connected to each other in different orientations by a universal coupling according to embodiments of the present technology.
Figure 5:
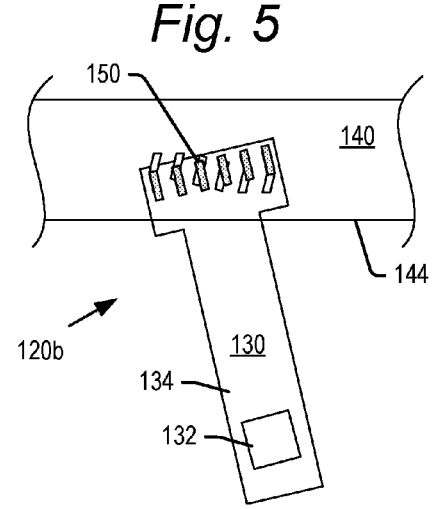

The microdisplay cameras 112a, 112b and eye tracking cameras 114a, 114b may be or include components affixed to flexible printed circuits which may be electrically and mechanically coupled to each other using a universal coupling according to embodiments of the present technology. FIGS. 4 and 5 show first and second FPC modules 120a and 120b, respectively, and FIG. 3 shows components which may be used to form the FPC modules 120a, 120b. In accordance with aspects of the present technology, despite having a different configuration, the FPC module 120a may be fabricated using elements which are identical to those used in the FPC module 120b.

In particular, FPC modules 120a and 120b may both include a first FPC component 130 connected to a second FPC component 140. The first FPC component 130 may include an electronic element 132 coupled to a flexible printed circuit 134. The second FPC component 140 may include an electronic element 142 coupled to a flexible printed circuit 144. The first FPC component 130 may be electrically and mechanically coupled to the second FPC component 140 via a universal coupling 150 as explained below. FIG. 3 shows two FPC components 130 positioned adjacent the second FPC component 140. The two FPC components 130 are shown for illustrative purposes, and it is understood that only one of the FPC components 130 would attach to the FPC component 140 (as shown in FIGS. 4 and 5).

Prior to assembly into FPC modules 120a, 120b, the electronic element 132 may be electrically and mechanically affixed to flexible printed circuit 134, and the electronic element 142 may be electrically and mechanically affixed to flexible printed circuit 144. The particular configurations and locations of the elements 132, 142 and the configurations of the flexible printed circuit 134, 144 within FPC components 130, 140 are by way of example only. It is understood that a wide variety of electronic elements and flexible printed circuits can be affixed to each other, using the universal coupling of the present technology, in a wide variety of configurations.

The electronic element 132 may have a pattern of electrical contacts that may be affixed to a like pattern of electrical contacts on the flexible printed circuit 134 using a conductive adhesive, ultrasonic bonding or other known affixation methods. The electronic element 142 may have a pattern of electrical contacts that may be affixed to a like pattern of electrical contacts on the flexible printed circuit 144 using a conductive adhesive, ultrasonic bonding or other known affixation methods.

As noted, in accordance with aspects of the present technology, at the time elements 132, 142 are coupled to flexible printed circuits 134, 144, there is no need to designate whether the parts are to be used in FPC module 120a or FPC module 120b. "Parts" as used herein refers to the individual electronic elements 132, 142 and individual flexible printed circuits 134, 144.

Not having to designate whether the parts are to be used in FPC module 120a or FPC module 120b at the time elements 132, 142 are coupled to flexible printed circuits 134, 144 provides a number of advantages. First, it reduces the number of different parts which need to be fabricated. Second, it simplifies inventory tracking. Third, it reduces the number of different types of tools required to fabricate the FPC components. Fourth, it simplifies production, in that it reduces the number of different processes that need to be managed. Fifth, it increases flexibility, in that instead of having two separate smaller lots of parts for FPC modules 120a and 120b, there is a single lot of parts which can be used in either of FPC modules 120a and 120b.

The universal coupling 150 enables the two or more different configurations of FPC modules 120a and 120b using the same FPC components 130 and 140. In embodiments, the universal coupling includes a first set of electrical contacts on one of the FPC components 130, 140, and a second set of electrical contacts on the other of the FPC components 130, 140. In general, the first and/or second set of electrical contacts may be configured so that predefined ones of the first set of electrical contacts electrically and mechanically mate with predefined ones of the second set of electrical contacts in two or more different orientations of the first FPC component 130 relative to the second FPC component 140. The first FPC module 120a may be formed by connecting the first FPC component 130 at a first angle to the second FPC component 140, and the second FPC module 120b may be formed by connecting the first FPC component 130 at a second angle to the second FPC component 140.

The first and/or second sets of electrical contacts 160, 170 may have a variety of configurations to connect with each other in two or more different orientations. One example is shown in FIGS. 3-5. In the embodiment shown, the electrical contacts 160 may be provided in an end portion of FPC component 130, and the electrical contacts 170 may be provided along an edge between end portions of the FPC component 140. However, it is understood that the electrical contacts 160, 170 may be provided anywhere along the lengths of FPC components 130, 140 in further embodiments.

In the embodiment of FIGS. 3-5, one of the FPC components, for example component 130, may include a set of rectangular contact pads 160. In embodiments, the edges of the contacts 160 may be parallel to edges of the FPC component 130. FIG. 3 shows a pair of FPC components 130 (one of which would be used as noted). Although shown at different angles for illustrative purposes, the two FPC components 130 are identical to each other.

In the embodiment of FIGS. 3-5, the second FPC component, FPC component 140 in this example, includes a set of electrical contacts 170. Each electrical contact 170 comprises a cross-hatch pattern with a first section 172 angled in a first direction and a second section 174 angled in a second direction. As shown in FIG. 4, the contacts 160 and sections 172 may each be provided with a width and pitch (spacing between contacts) so that, when the first FPC component 130 is joined to the second FPC component 140 at the first desired angular orientation, the first set of electrical contacts 160 overlie and mate with the first sections 172 of the electrical contacts 170. As shown in FIG. 5, the contacts 160 and sections 174 may each be provided with a width and pitch so that, when the first FPC component 130 is joined to the second FPC component 140 at the second desired angular orientation, the first set of electrical contacts 160 overlie and mate with the second sections 174 of the electrical contacts 170.

In the embodiment of FIGS. 3-5, the first and second components 130, 140 may be provided in one of two predefined orientations with respect to each other. In further embodiments, the first and second components 130, 140 may be provided in one of a range of different orientations with respect to each other. Examples of such embodiments will now be explained with reference to FIGS. 6-13.

Figure 6:
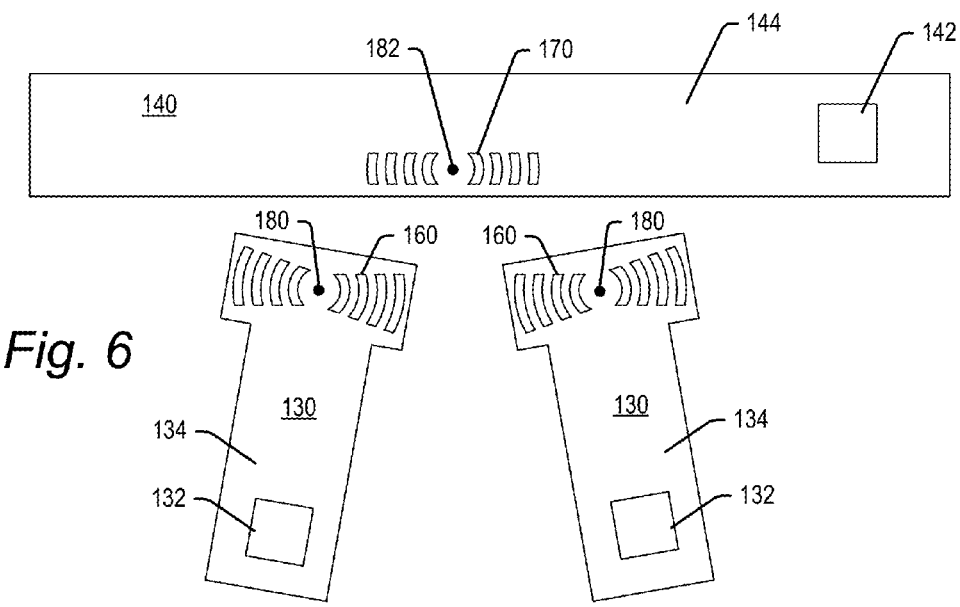
FIG. 6 shows flexible printed circuit modules to be connected by a universal coupling according to further embodiments of the present technology.
Figure 7:
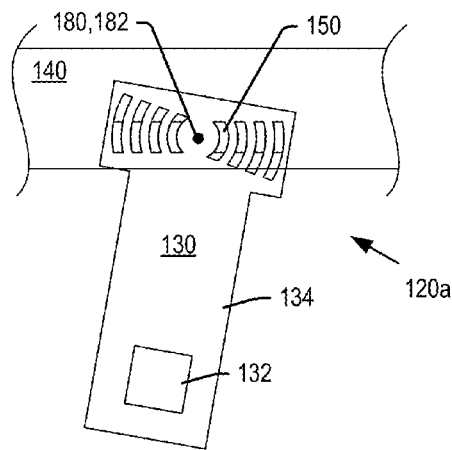
FIGS. 7 and 8 show two of the same flexible printed circuit modules connected to each other in different orientations by a universal coupling according to further embodiments of the present technology.
Figure 8:
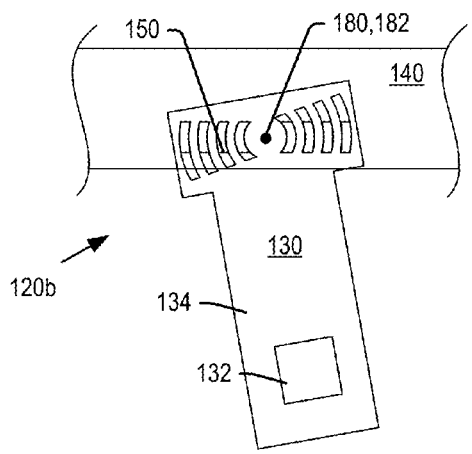

In FIGS. 6-8, one of the FPC components, for example component 130, may include a set of electrical contacts 160 having an arcuate shape. The electrical contacts 160 may be concentric about an axis of rotation 180 (into and out of the page of the figures and indicated by dot). FIG. 6 shows a pair of FPC components 130 (one of which would be used). Although shown at different angles for illustrative purposes, the two FPC components 130 are identical to each other.

In the embodiment of FIGS. 6-8, the second FPC component, FPC component 140 in this example, includes a set of electrical contacts 170 having an arcuate shape. The electrical contacts 170 may be concentric about an axis of rotation 182 (into and out of the page of the figures and indicated by a dot). The electrical contacts 160 on the first FPC component 130 may have a longer arclength than the electrical contacts 170 on the second FPC component 140.

When the FPC components 130 and 140 are affixed to each other within the universal coupling 150, the axes of rotation 180 and 182 may be aligned with each other. The arcuate contacts 160, 170 may each be provided with a width, pitch and radius of curvature so that, when the axes of rotation 180, 182 are aligned, the arcuate contacts 160 directly overlie the arcuate contacts 170.

Additionally, given that the arclengths of the contacts 160 are longer than the arclengths of contacts 170, the contacts 160 and 170 may overlie each other in a variety of configurations. FIG. 7 shows the contacts 160 and 170 overlying each other with the FPC component 130 rotated to one extreme. FIG. 8 shows the contacts 160 and 170 overlying each other with the FPC component 130 rotated to an opposite extreme. In addition to these extreme positions, the FPC component 130 may be oriented anywhere between the two extremes of FIGS. 7 and 8. In one example, this angular range may be 10°, though the angular range may be greater or smaller than that in further embodiments. The angular range between the two extremes may be increased by increasing the size of the arclength of the electrical contacts 160 relative to the arclength of contacts 170. As explained below with respect to FIG. 12, the arclength of the electrical contacts 160 and 170 may be increased all the way to 360°.

While the arclengths of contacts 160 are shown as being larger than the arclengths of contacts 170, it would also be possible to provide the arclengths of contacts 170 to be larger than the arclengths of contacts 160. This would also allow for a range of orientations of the FPC component 130 to the FPC component 140 as described above.

Figure 9:
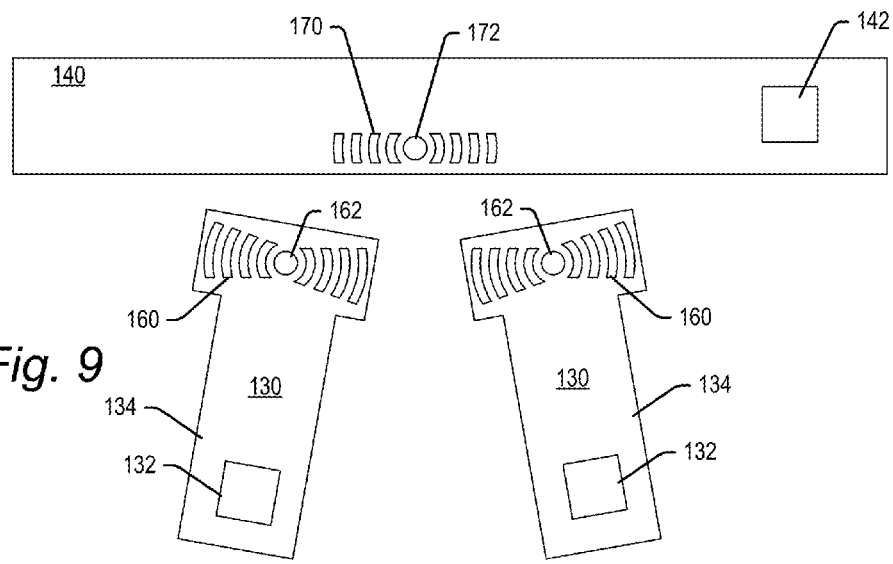
FIG. 9 shows flexible printed circuit modules to be connected by a universal coupling according to further embodiments of the present technology.
Figure 10:
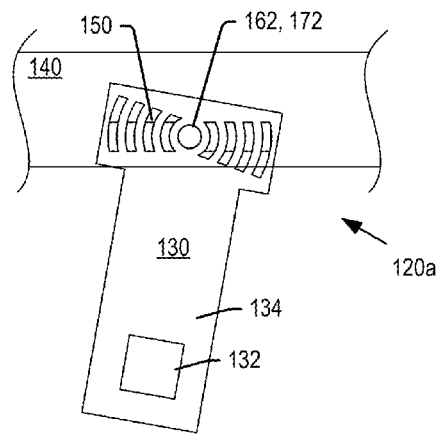
FIGS. 10 and 11 show two of the same flexible printed circuit modules connected to each other in different orientations by a universal coupling according to further embodiments of the present technology.
Figure 11:
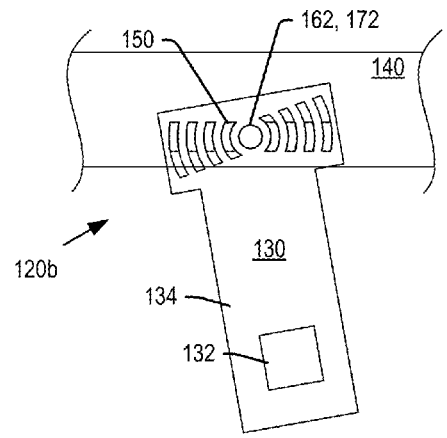

FIGS. 9-11 illustrate a further example where the electrical contacts 160, 170 of the universal coupling may be identical to those described above with respect to FIGS. 6-8, but may each further include a central electrical contact 162, 172. The central electrical contacts 162, 172 may be circular, and may have the same diameter as each other. One of the central electrical contacts 162, 172 may be larger than the other in further embodiments. When the contacts 160 and 170 are brought together in universal coupling 150, the central electrical contacts 162, 172 may electrically and mechanically affix to each other. Given that the central electrical contacts 162, 172 may have a larger surface area than the other electrical contracts 160, 170, the central electrical contacts may have a lower electrical impedance, and may for example be used for ground or power currents.

Figure 12:
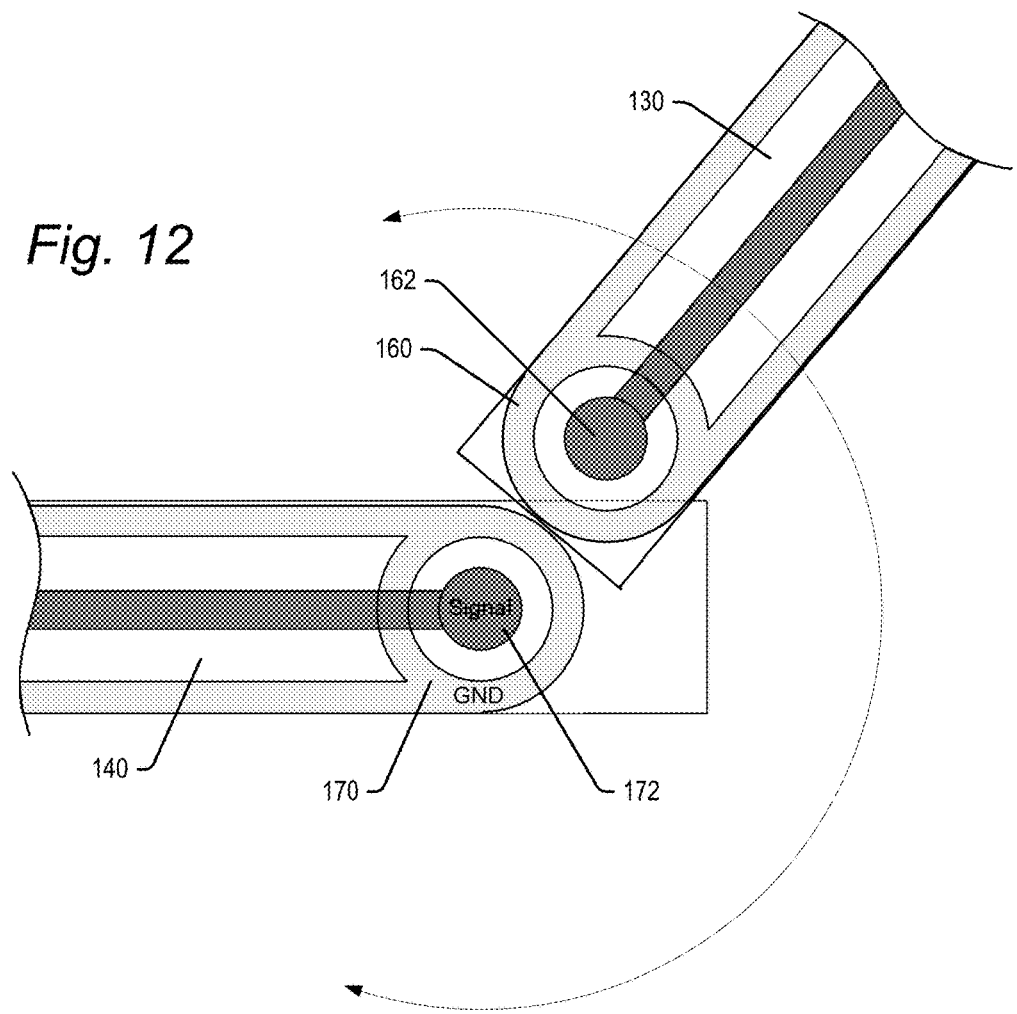
FIG. 12 shows a universal coupling according to a further embodiment of the present technology.
Figure 13:
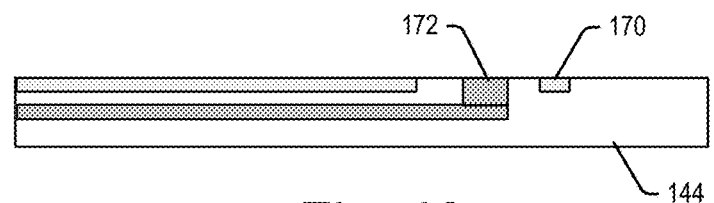
FIG. 13 shows an edge view of the flexible printed circuit board according to a further embodiment of the present technology.

FIGS. 12 and 13 illustrates a further embodiment of the present technology where the universal coupling 150 comprises contacts 160 and 170 that are completely circular. In particular, in this embodiment, the contacts 160 and 170 are arcuate and form a full 360° circle. In the embodiment shown, for each of the contacts 160, 170, a single circular contact is shown, surrounding a central contact 162, 172. One set of contacts, for example contacts 160, 170, may be used for ground voltages and the other set of contacts, for example central contacts 162, 172 may be used for signals. It is understood that there may be multiple concentric circular contacts in further embodiments for carrying ground and different signals.

The contacts 160 and 162 on FPC component 130 are prevented from shorting together as a result of the contacts extending through the flexible printed circuit 134 at different planes within the thickness of the flexible printed circuit 134. The contacts 170 and 172 on FPC component 140 are prevented from shorting together as a result of the contacts extending through the flexible printed circuit 144 at different planes within the thickness of the flexible printed circuit 144. FIG. 13 shows an edge view of the flexible printed circuit 144 (thickness exaggerated for clarity). The edge view of flexible printed circuit 144 shows the contacts 170, 172 at different elevations within the thickness of the flexible printed circuit 144. The flexible printed circuits 134, 144 may for example include a plated via allowing the recessed central contacts 162, 172 to be provided at a surface of the flexible printed circuit.

As the contacts 160, 162, 170 and 172 are all circular, the FPC component 130 may be affixed at any orientation, 360° around, to the FPC component 140. This provides additional flexibility to the design of the FPC modules 120a and 120b formed by the FPC components 130, 140.

The contacts 160 and 170 (including contacts 162, 172) in each of the above-described embodiments of the universal coupling may be formed of known materials, including for example varieties of an anisotropic conductive film. It is understood that the electrical contacts of the universal coupling may be formed of other materials in further embodiments.

The universal coupling 150 of the present technology provides an advantage in that it allows the FPC components 130, 140 to be affixed to each other in two or more different configurations. Thus, where for example a device includes two different FPC modules 120a, 120b with different configurations, the modules 120a, 120b can be formed with the same FPC components 130, and the same FPC components 140. This reduces the number of different parts and tooling to fabricate the different parts, and simplifies the fabrication process as explained above.

Figure 1A:
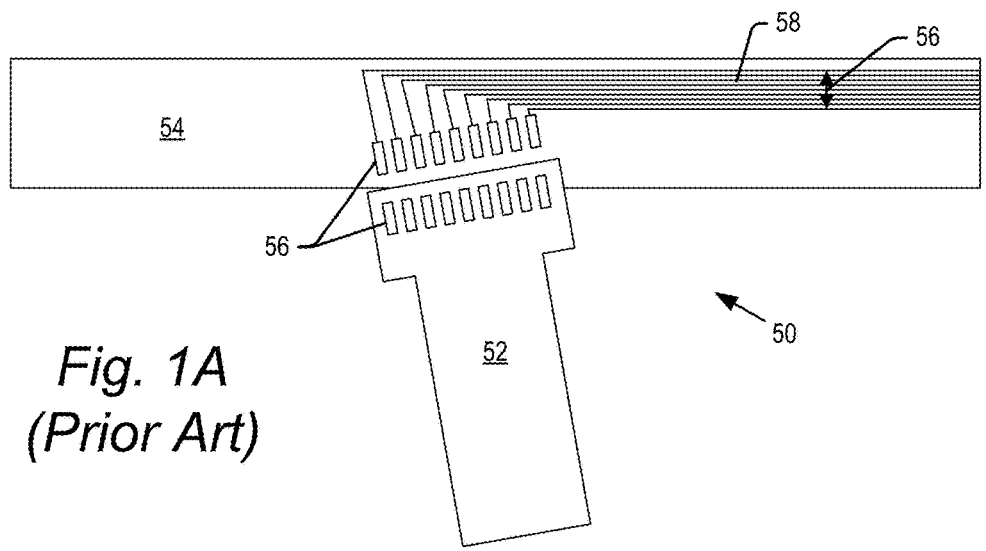
FIGS. 1A and 1B show examples of conventional flexible printed circuit modules including four separate parts.
Figure 1B:
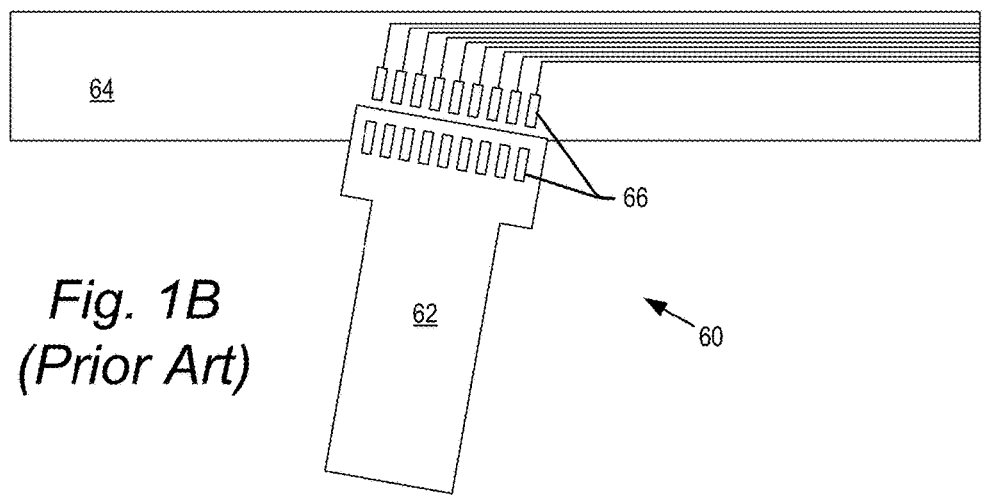

A further advantage of the universal coupling 150 is that it allows greater spacing between traces within the flexible printed circuits 134, 144. In particular, referring again to prior art FIG. 1A, where conventional contact pads are provided at a slant as shown, the traces connecting to those contacts are also at a slant. Consequently, when those traces turn so as to extend parallel to the edges of the flexible printed circuit (the parallel traces 58), the parallel traces 58 have a tight spacing. This limits the number of electrical traces which can be provided. By contrast, the contact 160 and/or 170 can be provided near to and parallel with an edge of the flexible printed circuits 134, 144. Additionally, traces can be provided straight off of the contacts 160 or 170 (i.e., perpendicular to an edge of flexible printed circuits 134 or 144). This enables the same number of electrical traces (such as traces 148 in FIG. 3) to be provided with greater spacing between the traces. In addition to ease of fabrication, the additional space may allow for more traces and contacts, or not be a limiting factor in the number of contacts that are provided.

In embodiments described above, the printed circuit is provided in a flexible medium. However, in further embodiments, the printed circuit may be fixed in a ridged medium, including for example a ridged FPC, a printed circuit board or other ceramic or ridged substrate. In such embodiments, both the FPC components 130 and 140 may be on a ridged medium. Alternatively, one of the FPC components (such as FPC component 140) may be ridged and the other (such as FPC component 130) may be flexible.

In summary, an example of the present technology relates to a universal coupling for affixing a first flexible printed circuit having a first component to a second flexible printed circuit having a second component, the universal coupling comprising: a first set of electrical contacts on the first flexible printed circuit; a second set of electrical contacts on the second flexible printed circuit, at least one of the first and second sets of electrical contacts configured to allow electrical and mechanical connection between the first and second sets of electrical contacts with the first flexible printed circuit in a first orientation to the second printed circuit, and to allow electrical and mechanical connection between the first and second sets of electrical contacts with the first flexible printed circuit in a second orientation to the second printed circuit, the first orientation being different than the second orientation.

In a further example, the present technology relates to a flexible printed circuit module, comprising: a first flexible printed circuit having a first electronic component; a second flexible printed circuit having a second electronic component; and a universal coupling for electrically and mechanically affixing the first flexible printed circuit to the second flexible printed circuit, the universal coupling comprising: a first set of electrical contacts on the first flexible printed circuit, and a second set of electrical contacts on the second flexible printed circuit, the first and second sets of electrical contacts configured with individual electrical contacts capable of electrically and physically mating with each other over a range of angles between the first and second flexible printed circuits.

In another example, the present technology relates to a device, comprising: a first flexible printed circuit module, comprising: a first flexible printed circuit having a first electronic component; a second flexible printed circuit having a second electronic component; and a first universal coupling for electrically and mechanically affixing the first flexible printed circuit to the second flexible printed circuit at a first angle; a second flexible printed circuit module, comprising: a third flexible printed circuit having a third electronic component; a fourth flexible printed circuit having a fourth electronic component; and a second universal coupling for electrically and mechanically affixing the third flexible printed circuit to the second flexible printed circuit at a second angle different than the first angle; wherein the first and third flexible printed circuits are identical to each other and the second and fourth flexible printed circuits are identical to each other.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. It is intended that the scope of the invention be defined by the claims appended hereto.

We claim:

1. A head mounted display device, comprising:
a glasses frame;
an optical assembly;
a camera positioned on the glasses frame;
an electronic element associated with the optical assembly; and
a flexible printed circuit module electrically coupling the camera and the electronic element, the flexible printed circuit module comprising a first flexible printed circuit component with a first set of electrical contacts and a second flexible printed circuit component with a second set of electrical contacts, the first and second sets of electrical contacts configured to be coupled via a universal coupling, where the universal coupling is configured to complete an electrical connection between the first and second sets of electrical contacts at multiple different orientations of the first set of electrical contacts relative to the second set of electrical contacts.

2. The head mounted display device of claim 1, wherein the first and second sets of electrical contacts are formed of an anisotropic conductive film.

3. The head mounted display device of claim 1, wherein the electrical contacts of the first set are formed of rectangular electrical contacts and the electrical contacts of the second set are formed of electrical contacts having a cross hatch pattern.

4. The head mounted display device of claim 1, wherein the electrical contacts of the first set are formed of electrical contacts having an arcuate shape with a first radius of curvature, and the electrical contacts of the second set are formed of electrical contacts having an arcuate shape with a second radius of curvature, the first radius of curvature being the same as the second radius of curvature.

5. The head mounted display device of claim 4, wherein the first and second sets of electrical contacts comprise circular electrical contacts.

6. The head mounted display device of claim 5, wherein at least one of the circular electrical contacts is configured to carry ground and at least another of the electrical contacts is configured to carry signals.

7. A head mounted display device, comprising:
a camera;
a first printed circuit coupled to the camera;
a second printed circuit having an electronic component; and
a universal coupling for electrically and mechanically coupling the first printed circuit to the second printed circuit, the universal coupling comprising:
a first set of electrical contacts on the first printed circuit, and
a second set of electrical contacts on the second printed circuit, the first and second sets of electrical contacts configured to electrically and physically mate at multiple different orientations of the first printed circuit relative to the second printed circuit.

8. The head mounted display device of claim 7, wherein at least one of the first and second printed circuits are provided in a flexible medium.

9. The head mounted display device of claim 7, wherein the electrical contacts of the first set are provided at an end of the first printed circuit, and the electrical contacts of the second set are provided at a middle section of the second printed circuit.

10. The head mounted display device of claim 7, wherein the first set of electrical contacts are formed of electrical contacts having an arcuate shape with a first radius of curvature, and the second set of electrical contacts are formed of electrical contacts having an arcuate shape with a second radius of curvature, the first radius of curvature being the same as the second radius of curvature.

11. The head mounted display device of claim 10, wherein a first electrical contact of the first set of electrical contacts mates with a second electrical contact of the second set of electrical contacts, the first electrical contact having a larger arclength than the second electrical contact.

12. The head mounted display device of claim 11, wherein the electrical contacts of the second set have the same arclength.

13. The head mounted display device of claim 11, wherein the electrical contacts of the first set have different arclengths.

14. A device, comprising:
a glasses frame;
multiple cameras mounted on the glasses frame; and
interchangeable flexible printed circuit modules coupling the multiple cameras to electronic components of the device, an individual interchangeable flexible printed circuit module comprising a first flexible printed circuit connected to an individual camera and second flexible printed circuit connected to an individual electronic component, the first and second flexible printed circuits configured to be coupled at multiple different orientations of the first flexible printed circuit relative to the second flexible printed circuit by a universal coupling.

15. The device of claim 14, further comprising optical assemblies, wherein the interchangeable flexible printed circuit modules are used to generate images for the optical assemblies.

16. The device of claim 15, wherein an individual flexible printed circuit module is associated with a microdisplay within the device.

17. The device of claim 14, wherein a first camera of the multiple cameras is an eye tracking camera and a second camera of the multiple cameras is a microdisplay camera.

18. The device of claim 17, wherein the universal coupling of the individual interchangeable flexible printed circuit module is configured to interchangeably couple either the eye tracking camera or the microdisplay camera to respective electronic components within the device.

19. The device of claim 14, wherein the multiple cameras of the device comprise:
a first eye tracking camera configured to capture images of a right eye of a user of the device; and
a second eye tracking camera configured to capture images of a left eye of the user of the device.

20. The device of claim 19, wherein the universal coupling of the individual interchangeable flexible printed circuit module is configured to interchangeably couple either the first eye tracking camera or the second eye tracking camera to respective electronic components of the device.

* * * * *